(12) United States Patent
Bunk

(10) Patent No.: US 6,646,439 B1
(45) Date of Patent: Nov. 11, 2003

(54) CIRCUIT ARRANGEMENT FOR DELIVERING POWER TO COILS

(75) Inventor: Paul Bernard Bunk, Eindhoven (NL)

(73) Assignee: Koninklijke Philips Electronics N.V., Eindhoven (NL)

( * ) Notice: Subject to any disclaimer, the term of this patent is extended or adjusted under 35 U.S.C. 154(b) by 0 days.

(21) Appl. No.: 10/191,444

(22) Filed: Jul. 9, 2002

(30) Foreign Application Priority Data

Jul. 9, 2002 (EP) .............................................. 01202628

(51) Int. Cl.$^7$ ................................................ G01N 3/00

(52) U.S. Cl. ...................................................... 324/322

(58) Field of Search ................................. 324/318, 322, 324/307, 309

(56) References Cited

U.S. PATENT DOCUMENTS

| | | | | |
|---|---|---|---|---|
| 4,733,342 A | * | 3/1988 | Mueller et al. | ............. 363/132 |
| 5,270,657 A | | 12/1993 | Wirth et al. | |
| 6,031,422 A | | 2/2000 | Ideler | |
| 6,353,354 B1 | * | 3/2002 | Detweiler et al. | .......... 327/423 |

FOREIGN PATENT DOCUMENTS

JP          01088171          7/1989

OTHER PUBLICATIONS

Mueller, O.M., et al.; "A High–Frequency 4–Switch GTO Speed–Up Inverter for the Generation of Fast–Changing MRI Gradient Fields"; Proceedings of the Annual Applied Power Electronices Conference, 8, 1993, pp. 806–812.
Steigerwald R.L. et al.; "High–Power, High–Performance Switching Amplifier for Driving Magnetic Resonance Imaging Gradient Coils"; 31st Annual IEEE Power Electronics Specialists Conference, 2000, pp. 643–648.

* cited by examiner

*Primary Examiner*—Diego Gutierrez
*Assistant Examiner*—Dixomara Vargas
(74) *Attorney, Agent, or Firm*—Thomas M. Lundin, Esq.

(57) ABSTRACT

The invention relates to a circuit arrangement for delivering power to coils (1, 2), which circuit arrangement includes a first and a second coil (1, 2) a first and a second voltage source (4, 5) and a first and a second quadrupole switching network (6, 7), the input (20) of the first quadrupole switching network (6) being connected to the first voltage source (4) and the second voltage source (5) being connected to at least one terminal (14, 15) of the second quadrupole switching network (7). Known switching arrangements have separate voltage sources for each individual power amplifier. In the circuit arrangement in accordance with the invention the two terminals (12, 13) at the output (22) of the first quadrupole switching network (6) are connected, each time via the first and the second coil (1, 2), respectively, to the two terminals (16, 17) at the output (23) of the second quadrupole switching network (7). It is advantageous that a common voltage source (5, 4, 4a) with a common capacity for delivering power to a plurality of coil systems can thus be provided.

11 Claims, 5 Drawing Sheets

CIRCUIT ARRANGEMENT FOR DELIVERING POWER TO COILS

BACKGROUND

Figure 1:
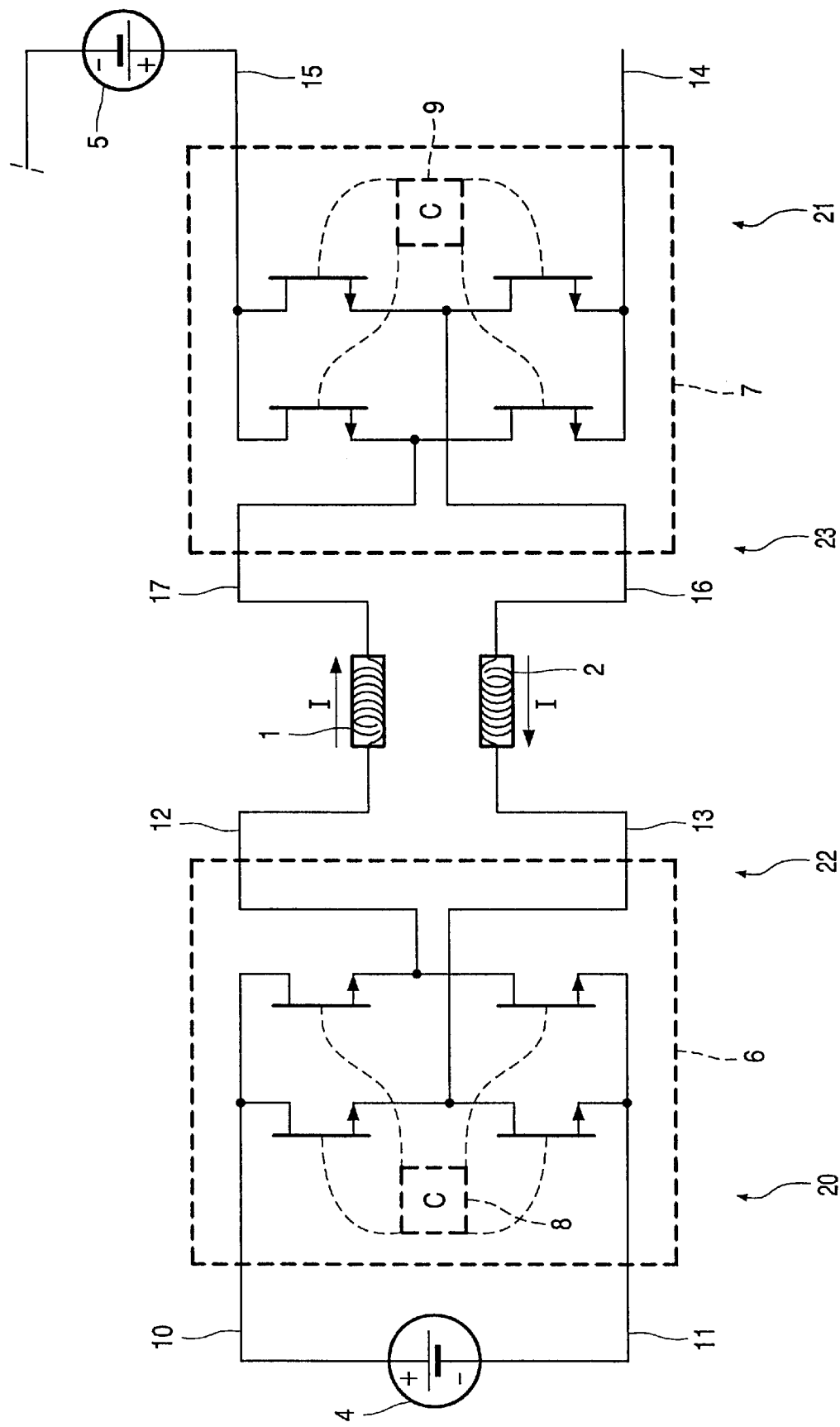

The invention relates to a circuit arrangement for delivering power to coils, notably to gradient coils of an MR apparatus, which circuit arrangement includes at least a first coil whose magnetic field interacts with that of at least a second coil, both coils being traversed by a current I, and also includes at least a first and a second voltage source and at least a first and a second quadrupole switching network which are provided with inputs for control and regulating signals via which the current I through the quadrupole switching network can be controlled, the two terminals at the input of the first quadrupole switching network being connected to the first voltage source in a potential embracing fashion and the second voltage source being connected to at least one terminal at the input of the second quadrupole switching network.

Magnetic resonance imaging methods play a crucial role in contemporary medical diagnostics. Such an imaging method is not hazardous to the patient and delivers spatial information concerning the examination volume and also offers sufficiently exact information as regards the types of tissue involved.

To this end the magnetic resonance imaging device utilizes the spins of the nuclei of hydrogen atoms which occur as protons in the tissue. Using external stationary and non-stationary magnetic fields produced by the MR apparatus, part of the protons is excited in such a manner that the emitted electromagnetic radiation provides information concerning the location of the emission on the basis of its frequency and phase. In order to enable individual types of tissues to be reliably distinguished, various characteristics of the tissue are used. Most important in this respect is the decay of the excitation while emitting energy, or in other words the longitudinal relaxation, and the dephasing of the spins due to interactions between the individual protons, that is, the transverse relaxation.

In the context of a typical magnetic resonance imaging method the magnetic moment of the protons is oriented in one spatial direction by means of a strong, stationary magnetic field of approximately 1.5 Tesla. Using brief electromagnetic RF pulses, the individual protons are excited to precession and are subsequently oriented again in conformity with the external, strong magnetic field. Notably the times for excitation and relaxation as well as the frequencies of the precessions are dependent on the tissue and in the context of the measurement they provide, in conjunction with spatial encoding of the excitation, information concerning the situation in space of different tissues. The spatial encoding utilizes location-dependent frequencies and phases of the precessional excitation and offers, via a Fourier transformation of the measured MR signal, information concerning the location of the relevant emission.

For a good image quality it is useful to utilize several characteristics of the relevant types of tissue in order to distinguish these types. A restrictive factor in achieving a suitable image quality within an acceptable examination time is the speed at which the magnetic fields in the MR apparatus can be varied. Therefore, it is an on-going aim to develop coil systems which enable high magnetic field strength transients in conjunction with amplifiers and voltage sources.

For the delivery of power to gradient coils it is already known to connect two amplifiers in series with the coils to be powered; one of these two amplifiers is customarily very powerful and generates the necessary voltage of the desired order of magnitude, whereas the other amplifier compensates any inaccuracies occurring. The output stages of the amplifiers are usually constructed as a full bridge by means of power transistors. These transistors are usually IGB transistors (Insulated Gate Bipolar transistors) or MOSFET transistors (Metal Oxide Semiconductor Field Effect Transistors) which are switched at frequencies of between 20 kHz and 100 kHz in order to realize the desired currents and current transients. The power amplifier generates the necessary voltages above all in the phases of high current transients, whereas the full bridge associated with the amplifier is connected in the forward direction in the phases of constant current.

The known circuit arrangements for delivering power to MR gradient coils necessitate the presence of separate voltage sources for each individual power amplifier. Because a conventional MR apparatus is always provided with three gradient coils in conformity with the three spatial co-ordinates, the manufacture of such an arrangement is very expensive. The conventional circuit arrangements have a further advantage in that the construction is usually asymmetrical so that a significant amount of insulation is required.

Considering the drawbacks of the present state of the art, it is an object of the invention to provide a circuit arrangement for delivering power to coils which enables the generation of as fast as possible magnetic field sequences in the MR apparatus and can be manufactured more economically at the same time. Furthermore, the circuit arrangement should have a modular construction which enables extensions and larger assemblies while at the same time reducing the number of components.

This object is achieved in accordance with the invention by means of a circuit arrangement for delivering power to coils of the kind set forth in which the two terminals at the output of the first quadrupole switching network are connected, via the first coil and the second coil, respectively, to the two terminals at the output of the second quadrupole switching network and in which the current I flows from the first quadrupole switching network, via the first coil, to the second quadrupole switching network and from the second quadrupole switching network, via the second coil, to the first quadrupole switching network.

A special advantage resides in the fact that a common voltage source with a common capacity can be provided so as to deliver power to a plurality of coil systems. The voltage sources customarily provided for the X direction, the Y direction and the Z direction can thus be replaced by a single voltage source which is available for each of the spatial directions as required. The first amplifier, consisting of the first voltage source and the first quadrupole switching network is usually not a very powerful type and is subject to small voltage transients only during switching events in the usually powerful second amplifier which consists of a second voltage source and a second quadrupole switching network, so that this first amplifier can be constructed more economically. A further advantage of the circuit arrangement resides in the inherent symmetry in the powering of the coils. At the same time the risk of damage in the first quadrupole switching network or the first voltage source is reduced in the case of faults in the second quadrupole switching network. The voltage sources used, moreover, can be advantageously arranged symmetrically with respect to ground, so that the insulation required for all components of the MR apparatus is reduced. The modular construction of the circuit arrangement, moreover, offers an advantageous possibility for refitting at a later stage, notably the refitting of the second quadrupole switching network with the second voltage source which together, as a power amplifier, advantageously extend the possibilities for use of the MR apparatus.

In an advantageous further embodiment of the invention, under the control of control signals at least one quadrupole switching network reverses the pole of the voltage at the output of the quadrupole switching network relative to the voltage at the input and/or decouples and/or chokes and/or amplifies this voltage and/or the terminals at the input and/or the terminals at the output can be short-circuited among themselves and/or to one another. In conjunction with the circuit arrangement in accordance with the invention, such switching features offer new degrees of freedom in delivering power to the coils which make optimum use of the power of the voltage sources and at the same time enable exact control of the delivery of power.

For a single-channel version of the circuit arrangement it is advantageous that the second voltage source is connected to the two terminals at the input of the second quadrupole switching network in a potential embracing fashion. The first voltage source is advantageously conceived for fine adjustment of the delivery of power to the coil and the second voltage source for generating the necessary order of magnitude of the coil current. Both voltage sources are customarily connected in parallel with a capacitance in order to avoid voltage surges. The symmetry of the circuit arrangement in respect of the two voltage sources and the resultant minimum insulation requirements are particularly advantageous.

For a multichannel construction of the circuit arrangement it is advantageous that voltage sources are connected in series each time with the first voltage source and that the total voltage is applied to the inputs of k parallel second quadrupole switching networks, that k–1 further first quadrupole switching networks are connected parallel to the first quadrupole switching network, that a first quadrupole switching network is associated each time with a second quadrupole switching network, that the terminals of the outputs of the first quadrupole switching networks are connected each time to an output of the associated second quadrupole switching network, each time via a coil, and that the two magnetic fields of the coils which connect the associated quadrupole switching networks to one another interact with one another. The advantages in accordance with the invention, notably in respect of the possibilities of extension and the modular configuration of the circuit arrangement, are particularly advantageous in the case of an extension to a multichannel configuration. Further channels can be added without modification of the initial configuration and the voltage sources present therein are advantageously used in common.

In order to ensure that voltage surges at the voltage sources are practically precluded, it is advantageous that j voltage sources can be connected, via a respective switch, in parallel with the first voltage source, that the parallel connected voltage is applied to the inputs of i+1 parallel second quadrupole switching networks, that i further first quadrupole switching networks are arranged parallel to the first quadrupole switching network, that a first quadrupole switching network is associated each time with a second quadrupole switching network, that the terminals of the outputs of the first quadrupole switching networks are connected each time to a terminal at the output of the associated second quadrupole switching network, each time via a coil, and that the two magnetic fields of the coils which interconnect the associated quadrupole switching networks interact with one another. The circuit arrangement can thus satisfy very severe requirements as regards voltage stability, even in the case of large currents.

In order to minimize the required amount of insulation, it makes sense when the number k of the additional parallel connected second quadrupole switching networks, the number i of the additional first quadrupole switching networks and the number j of the additional voltage sources which can be connected parallel to the first voltage source are even and when the arrangement of the additional first voltage sources, additional first quadrupole switching networks and the additional second quadrupole switching networks is configured so as to be symmetrical relative to the first voltage source or the first quadrupole switching network and the associated second quadrupole switching network. Such a symmetrical configuration on the one hand minimizes the amount of insulation required for all components of the MR apparatus and on the other hand ensures powerful feeding of the coils.

In order to enable the voltage requirements for the delivery of power to the coils to be met at all times, it is advantageous that the voltage sources are connected, via switches, in series with one another and with the first voltage source, and that when the switches are closed, the total voltage is applied to the inputs of the k parallel second quadrupole switching networks and the switches for parallel connection are opened by control when the switches for series connection are closed and the switches for series connection are opened by control when the switches for parallel connection are closed. This arrangement fully utilizes the capacity of the voltage sources and offers additional possibilities and degrees of freedom for control of the delivery of power to the coils.

In order to minimize also energy losses, it is advantageous that the two terminals at the output of at least one second quadrupole switching network are connected to one another via switches whereby the two coils can be connected in series in direct succession notably during the phases of constant current. The comparatively high dissipation of loss heat from the corresponding amplifier can be avoided at least partly during the phases of constant current.

The switches used for the parallel or series connection of the voltage sources and the switches used for the series connection of the coils are advantageously transistors, preferably IGB transistors or MOSFET transistors. It also makes sense to use IGB transistors or MOSFET transistors as the switches of the quadrupole switching networks.

In conjunction with the novel circuit arrangement it is advantageous that one of the four quadrupole switching networks at the input is connected each time to at least two transistors at both terminals, and that the transistors at the output side are connected pair-wise together to the two terminals at the output in a pole embracing fashion. The transistors, advantageously formed by IGB transistors or MOSFET transistors, allow for switching frequencies of 100 kHz and higher, so that a switching network of this kind is particularly well suitable for the required control of the delivery of power to the coils.

DRAWINGS

Figure 2:
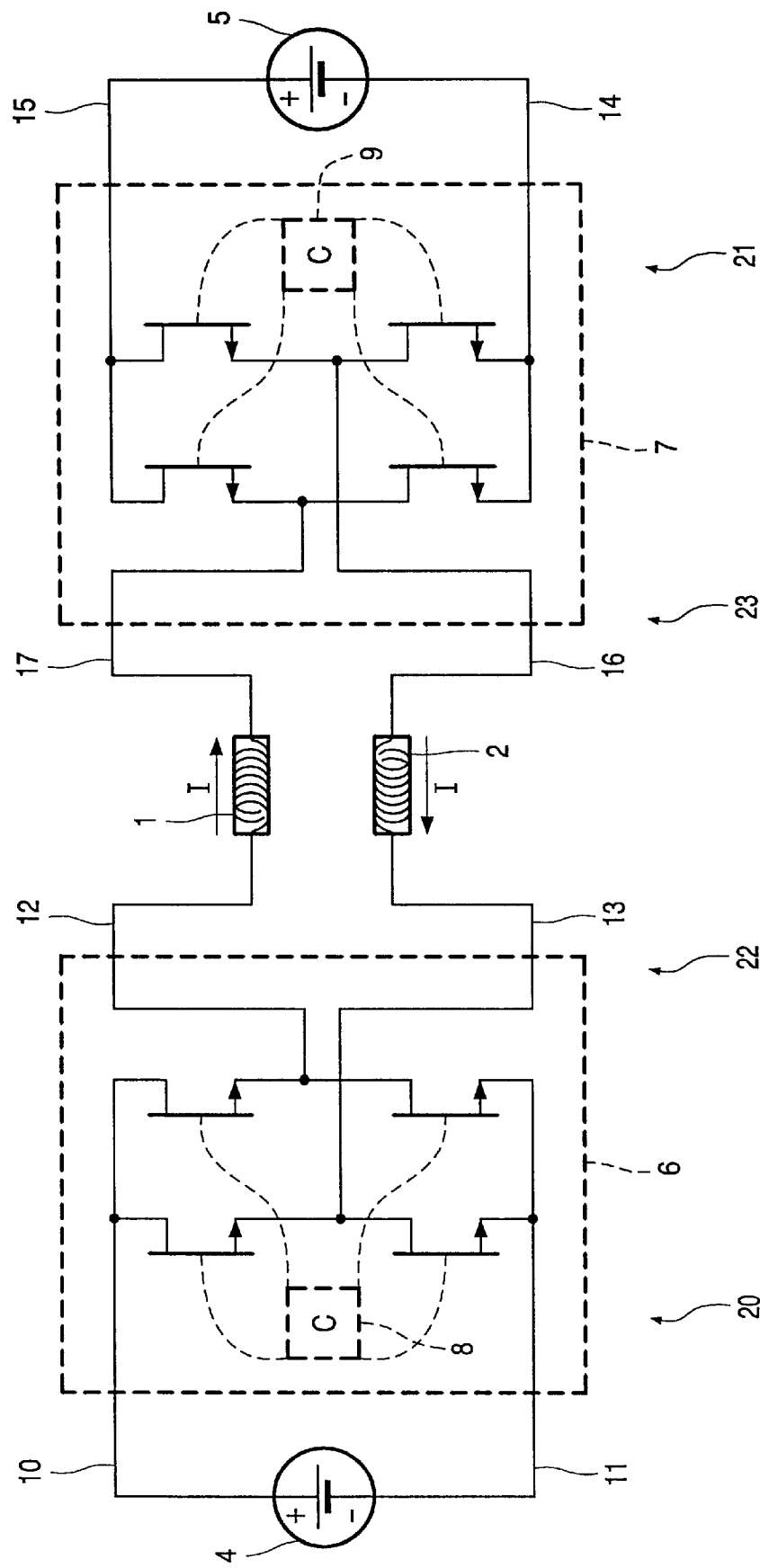
Figure 3:
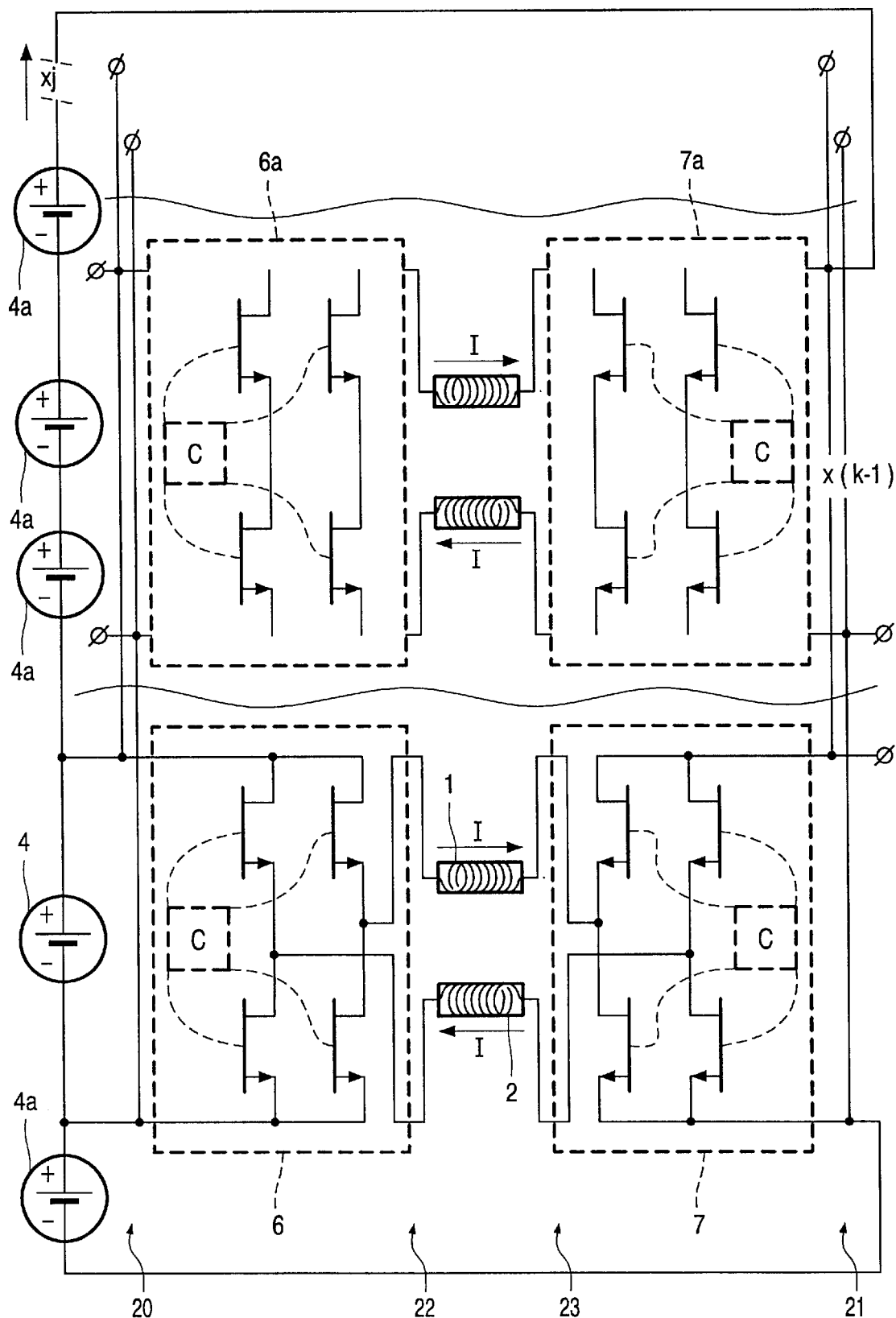
Figure 4:
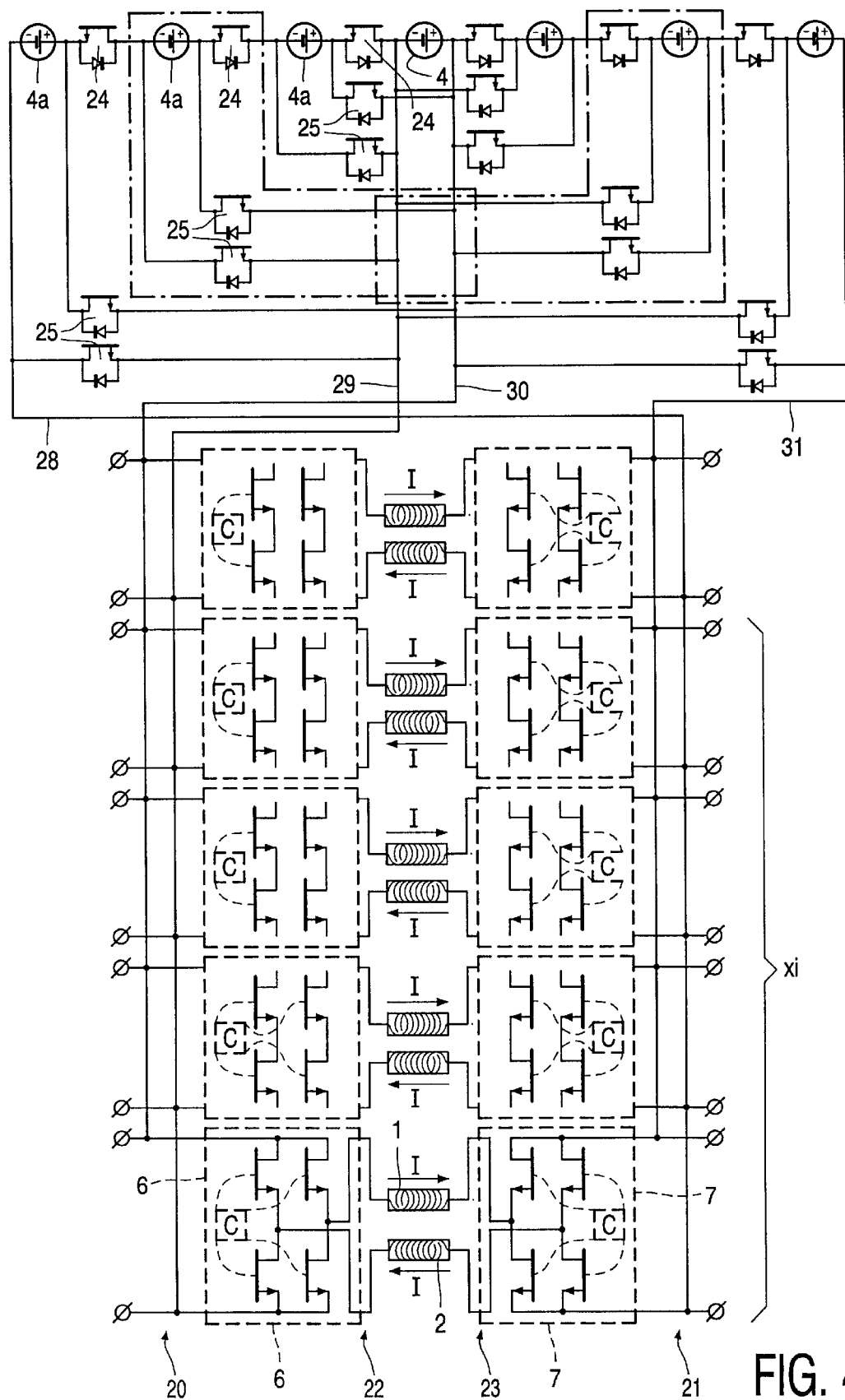
Figure 5:
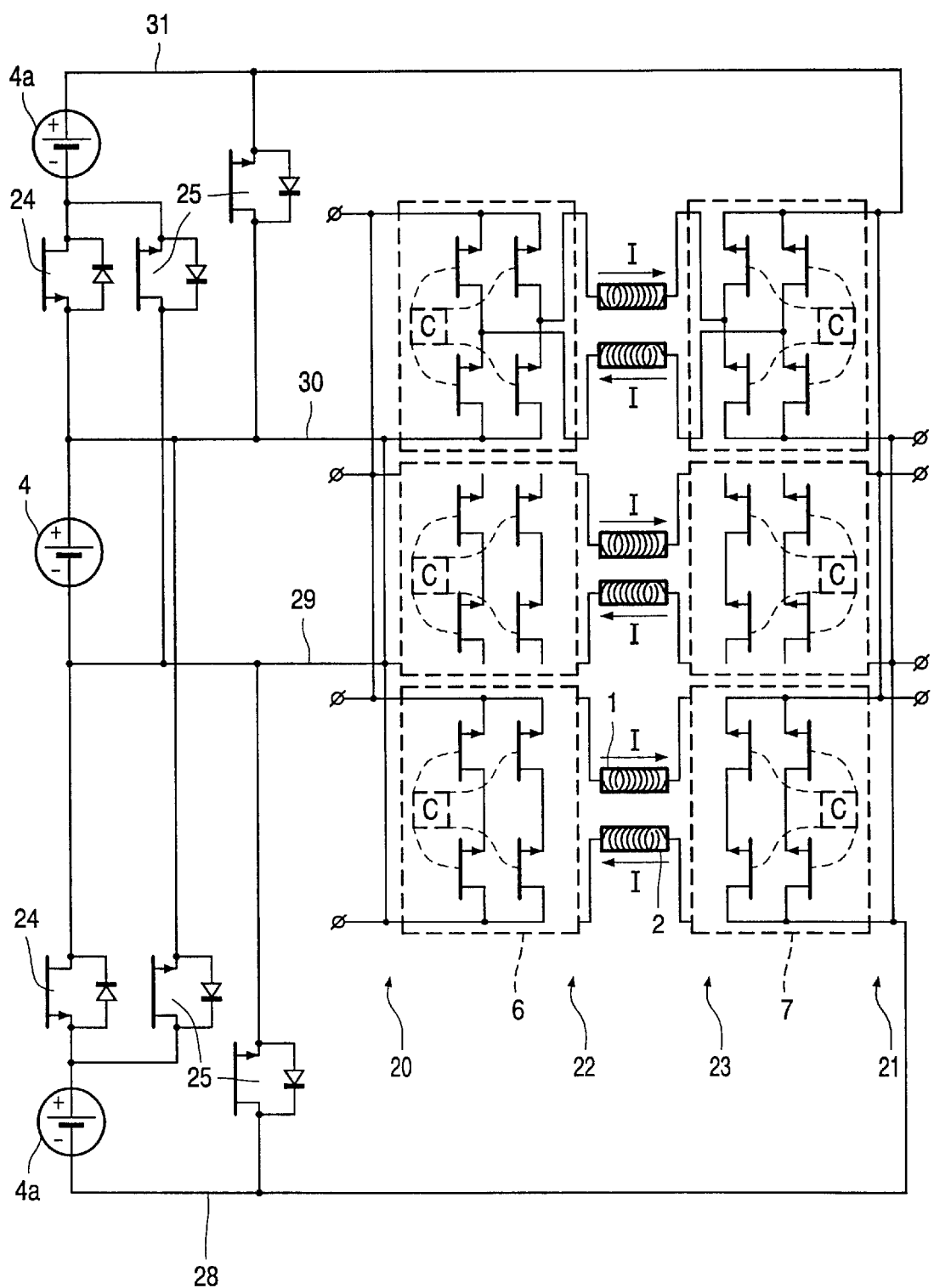

In order to elucidate the teachings of the invention, some embodiments thereof will be described in detail hereinafter, by way of example, with reference to the drawings. Therein:

FIG. 1 shows a basic single channel arrangement of two quadrupole switching networks, two voltage sources and two coils in accordance with the invention, FIG. 2 shows a special single channel arrangement of two quadrupole switching networks, two voltage sources and two coils in accordance with the invention, FIG. 3 shows a multichannel arrangement in accordance with the invention of configurations of switching networks, coils and voltage sources, FIG. 4 shows a symmetrical multichannel arrangement of quadrupole switching networks, coils and voltage sources, the voltage sources being connectable as necessary in parallel and in series relative to one another, and FIG. 5 shows a three-channel arrangement of voltage sources, quadrupole switching networks and coils in accordance with the invention, the voltage sources being connectable in parallel and in series.

DESCRIPTION

The coils to be powered are denoted by the reference numerals 1 and 2 in the FIGS. 1 and 2. The magnetic fields of the coils 1, 2 interact in such a manner that a substantially linear gradient of the magnetic field strength arises across the examination volume. The coils 1, 2 are components of an MR apparatus which are arranged within a main magnet which generates a stationary magnetic field of a strength of approximately 1.5 Tesla. Transmission and receiving coils for RF the excitation of a part of the protons in the examination volume so as to achieve precession are also arranged within the main magnet.

The coils 1, 2 receive power via a first quadrupole switching network 6 and a second quadrupole switching network 7 and a first voltage source 4 as well as a second voltage source 5. As is shown in FIG. 2, the second voltage source 5 can be connected in a potential embracing fashion to the two terminals 14, 15 at the input side of the second quadrupole switching network 7 or in series with the voltage source 4. In the case of the second arrangement the terminal 14 at the input side is also provided with a defined potential; for example, it is to be connected, via a further voltage source, to the terminal 11 at the input side of the first quadrupole switching network 6 or to ground. The quadrupole switching networks 6, 7 are provided with two terminals 10, 11, 14, 15 at their inputs 20, 21, each of said terminals receiving a respective direct voltage. The quadrupole switching networks 6, 7 are provided with each time two terminals 12, 13, 16, 17 at their outputs 22, 23, said terminals being pair-wise connected to the two coils 1, 2.

A current I flows, via the coil 1 which is connected to the output terminal 12 of the first quadrupole switching network 6, into the second quadrupole switching network 7, said current flowing back at the same strength, via the output terminal 16 of the second quadrupole switching network and the coil 2, into the first quadrupole switching network 6. Because of the connection configuration in accordance with the invention of the two quadrupole switching networks 6, 7 and the coils 1, 2 with interacting magnetic fields, symmetrical delivery of power to the coils 1, 2 is always ensured so that a practically linear gradient of the magnetic field occurs in the examination volume at all times. The quadrupole switching networks 6, 7 are constructed each time as full bridges, the two terminals 10, 11, 14, 15 at the input 20, 21 being connected each time to two IGB transistors 27 which are connected pair-wise a pole embracing fashion to two terminals 12, 13, 16, 17 at the output 22, 23. Whenever necessary, the transistors 27 are switched via inputs 8, 9 for control and regulating signals. The full bridge enables the potentials of the two terminals 10, 11, 14, 15 to be switched at will from the input 20, 21 to the output terminals 12, 13, 16, 17 while permitting pole reversal, short-circuiting, and switching of a potential to both output terminals at switching frequencies of 100 kHz and higher. The desired current I through the coils 1, 2 is thus generated.

FIG. 3 shows an extended version of the basic arrangement of the quadrupole switching networks, coils and voltage sources for an arbitrary number of channels. The voltage of a voltage source 4 is applied to the input 20 of a plurality of parallel connected first quadrupole switching networks 6, 6a. Further voltage sources 4a are connected in series with the voltage source 4, the total voltage of the voltage sources 4, 4a being applied to parallel connected inputs 21. The current I in each channel through the coils 1, 2 is controlled by means of the inputs 8, 9 for control and regulating signals of the first and the second quadrupole switching network 6, 6a, 7, 7a; the voltage sources 4, 4a are advantageously used by all channels in common.

FIG. 4 shows an example of the delivery of power in accordance with the invention to coils 1, 2 in a plurality of channels. The arrangement of quadrupole switching networks 6, 6a, 7, 7a and coils 1, 2 in accordance with the invention is connected in parallel each time at the input 20, 21 so as to be connected to four terminals 28, 29, 30, 31 of a particularly powerful and fast configuration of voltage sources 4, 4a in accordance with the invention. The voltage sources 4, 4a are connected in series via switches 24 and can be connected in parallel via switches 25. The switches 24 for the series connection are open when the switches 25 for the parallel connection are closed by the control and vice versa. In phases of large current transients, or in the case of voltage peaks, the voltage sources 4, 4a are connected in series so that the total voltage is present each time at the inputs 21 of the second quadrupole switching networks 7, 7a. The switches 24 and 25 are constructed as IGB transistors. The circuit arrangement is configured so as to be symmetrical relative to the central voltage source 4.

FIG. 5 shows a three-channel version which is attractive for the delivery of power to coils 1, 2 in the X, Y, Z direction.

The invention has been described with reference to the preferred embodiment. Obviously, modifications and alterations will occur to others upon reading and understanding the preceding detailed description. It is intended that the invention be construed as including all such modifications and alterations insofar as they come within the scope of the appended claims or the equivalents thereof.

What is claimed is:

1. A circuit arrangement for delivering power to coils, notably to gradient coils of an MR apparatus, said circuit arrangement comprising:

at least a first coil whose magnetic field interacts with that of at least a second coil, both coils being traversed by a current I;

at least a first and a second voltage source;

at least a first and a second quadrupole switching network which are provided with inputs for control and regulating signals via which the current I through the quadrupole switching networks can be controlled, the first quadrupole switching network having two terminals at its input and two terminals at its output, and the second quadropole switching network having at least one terminal at its input and two terminals at its output, the two terminals at the input of the first quadrupole switching network being connected to the first voltage source in a potential embracing fashion and the second voltage source being connected to at least one terminal at the input of the second quadrupole switching network, wherein, the two terminals at the output of the first quadrupole switching network are connected, via the first coil and the second coil, respectively, to the two terminals at the output of the second quadrupole switching network, and the current I flows from the first quadrupole switching network, via the first coil, to the second quadrupole switching network and from the second quadrupole switching network, via the second coil, to the first quadrupole switching network.

2. A circuit arrangement as claimed in claim 1, wherein under the control of control signals at least one of the first and second quadrupole switching networks reverses the pole of the voltage at the output of the quadrupole switching network relative to the voltage at the input and/or decouples and/or chokes and/or amplifies this voltage and/or the terminals at the input and/or the terminals at the output can be short-circuited among themselves and/or to one another.

3. A circuit arrangement as claimed in claim 1, wherein the second voltage source is connected to the two terminals at the input of the second quadrupole switching network in a potential embracing fashion.

4. A circuit arrangement as claimed in claim 1, wherein:
voltage sources are connected in series each time with the first voltage source and the total voltage is applied to the inputs of k parallel second quadrupole switching networks, k−1 further first quadrupole switching networks are connected parallel to the first quadrupole switching network, a first quadrupole switching network is associated each time with a second quadrupole switching network, the terminals of the outputs of the first quadrupole switching networks are connected each time to an output of the associated second quadrupole switching network, each time via a coil, and the two magnetic fields of the coils which interconnect the associated quadrupole switching networks interact with one another.

5. A circuit arrangement as claimed in claim 4 wherein i, j and k are even numbers and that the arrangement of the additional first voltage sources and additional first quadrupole switching networks is symmetrical relative to the first voltage source or to the first quadrupole switching network.

6. A circuit arrangement as claimed in claim 1, wherein j voltage sources are connected, via a respective switch, in parallel with the first voltage source, the parallel connected voltage is applied to the inputs of i+1 parallel second quadrupole switching networks, i further first quadrupole switching networks are arranged parallel to the first quadrupole switching network, a first quadrupole switching network is associated each time with a second quadrupole switching network, the terminals of the outputs of the first quadrupole switching networks are connected each time to a terminal at the output of the associated second quadrupole switching network, each time via a coil, and the two magnetic fields of the coils which interconnect the associated quadrupole switching networks interact with one another.

7. A circuit arrangement as claimed in claim 6, wherein the voltage sources are connected, via switches, in series with one another and with the first voltage source, and when the switches are closed, the total voltage is applied to the inputs of the k parallel second quadrupole switching networks and the switches for parallel connection are opened by control when the switches for series connection are closed and the switches for series connection are opened by control when the switches for parallel connection are closed.

8. A circuit arrangement as claimed in claim 7, wherein the switches are transistors.

9. A circuit arrangement as claimed in claim 1, wherein the two terminals at the output of at least one second quadrupole switching network are connected to one another via switches whereby the two coils can be connected in series in direct succession notably during the phases of constant current.

10. A circuit arrangement as claimed in claim 9, wherein the switches are transistors.

11. A circuit arrangement as claimed in claim 1, wherein at least one of the quadrupole switching networks at the input is connected to each time at least two transistors at both terminals, and the transistors at the output side are connected pair-wise together to the two terminals at the output in a pole embracing fashion.

* * * * *